(12) United States Patent
Li et al.

(10) Patent No.: US 12,164,201 B2
(45) Date of Patent: Dec. 10, 2024

(54) CHIP ON FILM AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Huihui Li, Beijing (CN); Wenchao Bao, Beijing (CN); Song Meng, Beijing (CN)

(73) Assignees: HEFEI BOE JOINT TECHNOLOGY CO., LTD. (CN); BOE TECHNOLOGY GROUP CO., LTD. (CN)

( * ) Notice: Subject to any disclaimer, the term of this patent is extended or adjusted under 35 U.S.C. 154(b) by 522 days.

(21) Appl. No.: 17/478,267

(22) Filed: Sep. 17, 2021

(65) Prior Publication Data
US 2022/0269123 A1    Aug. 25, 2022

(30) Foreign Application Priority Data

Feb. 19, 2021   (CN) .......................... 202110189453.3

(51) Int. Cl.
G02F 1/1345    (2006.01)
(52) U.S. Cl.
CPC ................................ *G02F 1/13458* (2013.01)
(58) Field of Classification Search
None
See application file for complete search history.

(56) References Cited

U.S. PATENT DOCUMENTS

| | | |
|---|---|---|
| 2003/0218190 A1 | 11/2003 | Hashimoto |
| 2005/0127493 A1 | 6/2005 | Yuzawa |
| 2009/0153791 A1 | 6/2009 | Chang et al. |
| 2019/0198438 A1 | 6/2019 | Kim et al. |
| 2020/0027821 A1 | 1/2020 | Lo et al. |
| 2020/0375028 A1 | 11/2020 | Lee et al. |

FOREIGN PATENT DOCUMENTS

| | | |
|---|---|---|
| CN | 1627513 A | 6/2005 |
| CN | 101217135 A | 7/2008 |
| CN | 109644550 A | 4/2019 |
| CN | 110739291 A | 1/2020 |

(Continued)

OTHER PUBLICATIONS

"First Chinese Office Action", corresponding to CN 202110189453.3, Feb. 14, 2022, (17 pages, including English translation).

*Primary Examiner* — Thanh Nhan P Nguyen
(74) *Attorney, Agent, or Firm* — Myers Bigel, P.A.

(57) ABSTRACT

The present disclosure provides a chip on film and a display device. The chip on film includes: a first end, wherein a first row of bonding terminals and a second row of bonding terminals are arranged on a first surface of the first end, the first row of bonding terminals and the second row of bonding terminals are spaced apart and insulated from each other, and the first row of bonding terminals is closer to a center of the chip on film than the second row of bonding terminals; and a plurality of leads, extending in a second direction and including a first part and a second part. A first end section of each lead of the first part serves as one of the first row of bonding terminals, a first end section of each lead of the second part serves as one of the second row of bonding terminals.

20 Claims, 6 Drawing Sheets

(56) References Cited

FOREIGN PATENT DOCUMENTS

| | | |
|---|---|---|
| CN | 111176037 A | 5/2020 |
| CN | 212136426 U | 12/2020 |
| CN | 109644550 B | 3/2022 |
| JP | 2003332380 A | 11/2003 |
| KR | 20190098631 A | 8/2019 |
| TW | 200926366 A | 6/2009 |

CHIP ON FILM AND DISPLAY DEVICE

RELATED APPLICATION

This application claims the priority of Chinese Patent Application No. 202110189453.3 filed on Feb. 19, 2021, and the entire disclosure of which is incorporated herein by reference.

TECHNICAL FIELD

The present disclosure relates to the field of display technology, and in particular, to a chip on film and a display device comprising the chip on film.

BACKGROUND

With the continuous development of display technology, users have put forward higher and higher requirements for the resolution of display devices. The display device usually comprises a display panel, a printed circuit board, and an electrical connection component that connects the display panel and the printed circuit board. The electrical connection component comprises an integrated circuit (IC) chip. According to the way the IC chip is mounted on the display panel, the electrical connection component may generally be divided into several types such as CoG (Chip on Glass), CoP (Chip on Plastic), and CoF (Chip on Flex, or, Chip on Film). COG refers to attaching the IC chip to the glass substrate of the display panel, COP refers to attaching the IC chip to the plastic substrate of the display panel, and COF refers to attaching the IC chip to the flexible circuit board, also known as chip on film. When a chip on film is used in a display device, the externally applied signal is transmitted to the IC chip of the chip on film through the printed circuit board, and the IC chip processes the signal and sends it to individual pixels of the display panel, so that the display panel can display a corresponding image.

SUMMARY

According to an aspect of the present disclosure, a chip on film is provided, comprising: a first end, a first row of bonding terminals and a second row of bonding terminals being arranged in a first direction on a first surface of the first end, the first row of bonding terminals and the second row of bonding terminals being spaced apart and insulated from each other, and the first row of bonding terminals being closer to a center of the chip on film than the second row of bonding terminals; and a plurality of leads, extending in a second direction intersecting with the first direction, the plurality of leads comprising a first part and a second part. The first part is arranged on the first surface of the chip on film, a number of leads in the first part is equal to a number of bonding terminals in the first row of bonding terminals, and a first end section of each lead of the first part serves as a corresponding one of the first row of bonding terminals. A body of the second part is arranged on a second surface of the chip on film facing away from the first surface, a first end section of the second part penetrates the chip on film and is arranged on the first surface of the chip on film, a number of leads in the second part is equal to a number of bonding terminals in the second row of bonding terminals, and the first end section of each lead of the second part serves as a corresponding one of the second row of bonding terminals.

In some embodiments, the plurality of leads are divided into a plurality of lead groups, and a spacing between two adjacent leads in each lead group of the plurality of lead groups is equal.

In some embodiments, each lead group further comprises a plurality of pads, and a number of the plurality of pads is equal to a number of leads in each lead group, and a second end section of each lead in each lead group opposite to the first end section is connected to a corresponding one of the plurality of pads.

In some embodiments, the spacing between two adjacent leads in each lead group is smaller than a spacing between two adjacent lead groups.

In some embodiments, the spacing between two adjacent lead groups is greater than a width of the pad in the first direction.

In some embodiments, a width of the first end section of each lead in the first direction is greater than a width of the second end section of each lead in the first direction.

In some embodiments, the spacing between two adjacent leads in each lead group is equal to a spacing between two adjacent lead groups.

In some embodiments, the spacing between two adjacent lead groups is smaller than a width of the pad in the first direction.

In some embodiments, in adjacent first lead group and second lead group of the plurality of lead groups, a first lead at an edge in the first lead group is connected to a first pad, and a second lead in the second lead group adjacent to the first lead is connected to a second pad. The second pad is offset from the first pad by a first distance in the first direction, the first distance is smaller than a width of the first pad in the first direction, and the second pad is offset from the first pad by a second distance in the second direction.

In some embodiments, each lead in a part of the plurality of lead groups is a bent line.

In some embodiments, lengths of the plurality of leads in each lead group gradually decrease in the first direction, or, lengths of the plurality of leads in one lead group of the plurality of lead groups gradually increase in the first direction, and lengths of the plurality of leads in another lead group adjacent to the one lead group gradually decrease in the first direction.

In some embodiments, in each lead group, one lead is connected to a third pad, and another lead adjacent to the one lead is connected to a fourth pad. The fourth pad is offset from the third pad by a third distance in the first direction, and the third distance is smaller than a width of the third pad in the first direction, the fourth pad is offset from the third pad by a fourth distance in the second direction, and the fourth distance is greater than a length of the third pad in the second direction.

In some embodiments, a number of pads in each lead group satisfies the formula:

$$\frac{w + (m+h)*(x-1)}{x} \geq h_0$$

where x is the number of pads in each lead group, w is a width of the pad in the first direction, m is a width of the lead in the first direction, h is the spacing between two adjacent leads, $h_0$ is a bonding pitch between two adjacent bonding terminals in the first row of bonding terminals or the second row of bonding terminals.

In some embodiments, the second row of bonding terminals is offset by a distance in the first direction relative to the first row of bonding terminals, and each of the second row of bonding terminals is between two adjacent bonding terminals in the first row of bonding terminals.

In some embodiments, the chip on film further comprises: a second end opposite to the first end; and a widening portion between the first end and the second end. A width of the widening portion in the first direction is greater than a width of the first end and a width of the second end in the first direction.

In some embodiments, the chip on film further comprises an integrated circuit. The integrated circuit is arranged at the widening portion, and the first row of bonding terminals and the second row of bonding terminals are respectively connected to the integrated circuit through the first part and the second part of the plurality of leads.

According to another aspect of the present disclosure, a display device comprising a display panel, a circuit board, and at least two chip on films described in any of the foregoing embodiments is provided.

In some embodiments, each of the at least two chip on films further comprises a second end opposite to the first end, a third row of bonding terminals and a fourth row of bonding terminals are arranged in the first direction on the first surface of the second end, the third row of bonding terminals and the fourth row of bonding terminals are spaced apart and insulated from each other, and the third row of bonding terminals is closer to the center of the chip on film than the fourth row of bonding terminals. The first end of each chip on film is bonded to the display panel through the first row of bonding terminals and the second row of bonding terminals, and the second end of each chip on film is bonded to the circuit board through the third row of bonding terminals and the fourth row of bonding terminals.

In some embodiments, a bonding pitch between two adjacent bonding terminals in the first row of bonding terminals is equal to a bonding pitch between two adjacent bonding terminals in the second row of bonding terminals, a bonding pitch between two adjacent bonding terminals in the third row of bonding terminals is equal to a bonding pitch between two adjacent bonding terminals in the fourth row of bonding terminals, and the bonding pitch between two adjacent bonding terminals in the first row of bonding terminals is smaller than the bonding pitch between two adjacent bonding terminals in the third row of bonding terminals.

In some embodiments, each chip on film further comprises a widening portion between the first end and the second end. A width of the widening portion in the first direction is greater than a width of the first end and a width of the second end in the first direction, and the widening portions of two adjacent chip on films of the at least two chip on films are arranged in a staggered manner.

BRIEF DESCRIPTION OF THE DRAWINGS

In order to more clearly describe the technical solutions in the embodiments of the present disclosure, the drawings needed in the embodiments will be briefly introduced in the following. Obviously, the drawings described in the following are only some embodiments of the present disclosure. For those of ordinary skill in the art, other drawings can also be obtained based on these drawings without creative work.

DETAILED DESCRIPTION OF THE DISCLOSURE

Figure 1:
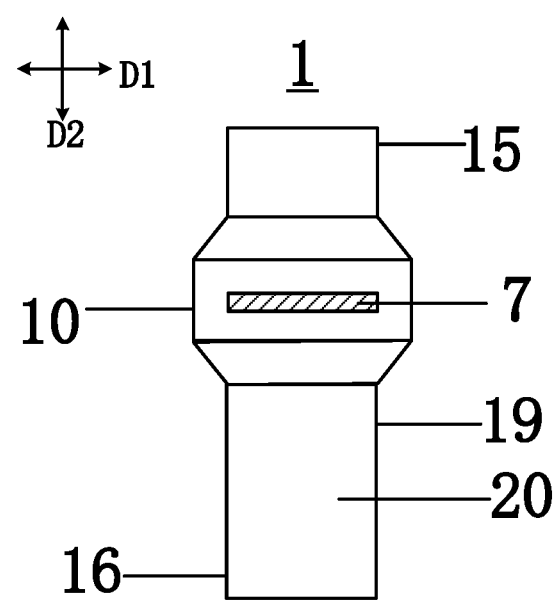
FIG. 1 illustrates a structure of a chip on film according to an embodiment of the present disclosure.

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure. It should be noted that, for ease of description, only components related to the technical solutions of the embodiments of the present disclosure are shown in the drawings, and other components are omitted. In addition, it should be noted that the embodiments in the present disclosure and the features in the embodiments can be combined with each other without conflict.

In order to achieve a clearer display effect and a better visual experience, the resolution of the display device is becoming higher and higher. The resolution of the display device refers to the number of pixels on the screen of the display panel. The higher the resolution, the greater the number of pixels on the screen, and correspondingly the smaller the size of a single pixel. For example, in current display panels, especially large-size display panels, the resolution of the display panel can reach 8 k or even higher. The higher the resolution of the display panel, the greater the number of leads (such as data lines) that need to be arranged. Since the IC chip of the chip on film is arranged on a separate flexible circuit board instead of the substrate of the display panel, the width of the frame of the display device can be reduced, the display area of the display panel can be increased, and the high resolution of the display device can be realized. Therefore, more and more display devices use the chip on film.

A plurality of bonding terminals are arranged on the chip on film, and these bonding terminals are bonded with the display panel, thereby realizing electrical connection with the data lines of the display panel. Since a display device with high resolution is provided with a large number of data lines, a large number of bonding terminals are correspondingly required, and therefore a large number of chip on films are required. Due to electrical requirements and equipment process limitations, the bonding pitch between two adjacent bonding terminals has a minimum limit. The inventor(s) of the present application found that the arrangement of the chip on film in the display device and the arrangement of the bonding terminals on the chip on film in the related art greatly limit the number of chip on films in the display device, thus limiting the number of bonding terminals of the chip on films, which cannot match the large number of data lines of the display device with high resolution.

Figure 2:
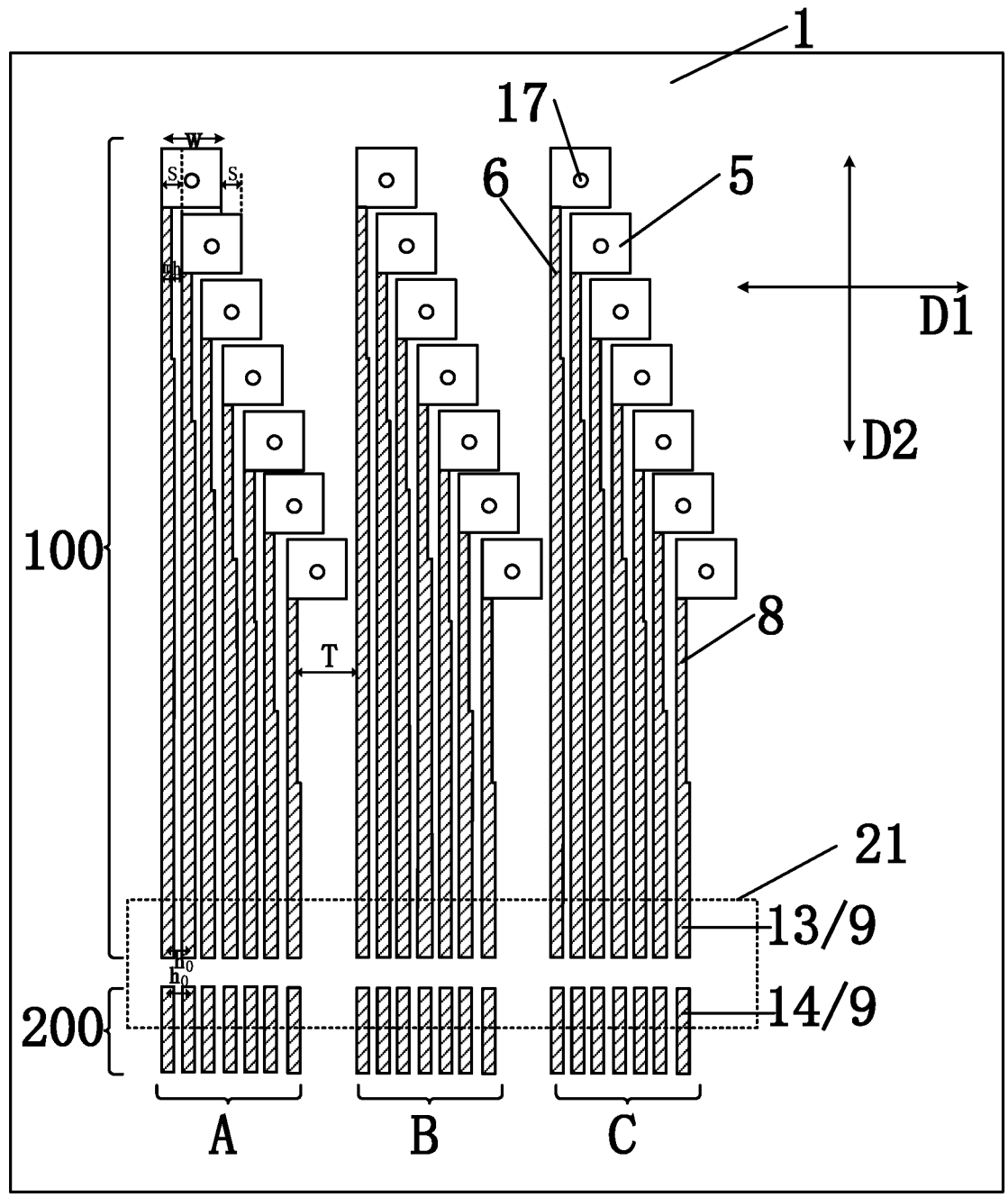
FIG. 2 illustrates an arrangement of leads on the first surface of the chip on film of FIG. 1.

In view of this, the embodiments of the present disclosure provide a chip on film. FIG. 1 illustrates a structure of the chip on film 1, and FIG. 2 illustrates the arrangement of the leads on the first surface 19 of the chip on film 1 (that is, the lower surface of the chip on film 1 illustrated in FIG. 1). Referring to FIGS. 1 and 2, the chip on film 1 comprises a first end 15, a first row of bonding terminals 13 and a second row of bonding terminals 14 are arranged along the first direction D1 on the first surface 19 of the first end 15. The first row of bonding terminals 13 and the second row of bonding terminals 14 are spaced apart and insulated from each other, and the first row of bonding terminals 13 is closer to the center of the chip on film 1 than the second row of bonding terminals 14. That is, the second row of bonding terminals 14 is closer to the edge of the first end 15 of the chip on film 1 than the first row of bonding terminals 13.

The chip on film 1 further comprises a plurality of leads 6 extending in a second direction D2 intersecting with the first direction D1. The first direction D1 may be the horizontal direction in FIG. 2, and the second direction D2 may be a direction perpendicular to the first direction D1 in FIG. 2. Of course, the second direction D2 may not be perpendicular to the first direction D1, but forms any angle other than 90 degrees to the first direction D1. The plurality of leads 6 comprises a first part 100 and a second part 200, the first part 100 is arranged on the first surface 19 of the chip on film 1, and the number of leads in the first part 100 is equal to the number of bonding terminals in the first row of bonding terminals 13, and a first end section 9 of each lead 6 in the first part 100 serves as a corresponding one of the first row of bonding terminals 13. The body of the second part 200 (not illustrated in the figure) is arranged on a second surface of the chip on film 1 facing away from the first surface 19 (that is, the upper surface of the chip on film 1 in FIG. 1), a first end section 9 of the second part 200 penetrates the chip on film 1 and is arranged on the first surface 19 of the chip on film 1, and the number of leads of the second part 200 is equal to the number of bonding terminals in the second row of bonding terminals 14, and the first end section 9 of each lead 6 in the second part 200 serves as a corresponding one of the second row of bonding terminals 14.

In other words, the body of each lead 6 functions as a lead, and the first end section 9 of each lead 6 serves as a bonding terminal. The IC chip 7 on the chip on film 1 transmits the signal to the bonding terminal through the body of the lead, the bonding terminals are bonded to the display panel and hence are electrically connected to the data lines of the display panel, so the signal of the IC chip 7 can be transmitted to the data lines of the display panel.

Bonding terminals are usually called "golden connecting fingers", because the outer surface of the bonding terminals is usually plated with a layer of gold and the entire row of bonding terminals are arranged like fingers, they are usually called "golden connecting fingers". During the bonding process, an anisotropic conductive film (ACF) is usually used to bond the bonding terminals of the chip on film 1 with the display panel (or the printed circuit board). The anisotropic conductive film contains gold balls. During the hot pressing process, the gold balls in the anisotropic conductive film rupture to cover the outer surface of the bonding terminals, so that the outer surface of the bonding terminals is plated with a layer of gold. Gold has strong oxidation resistance, which can protect the internal circuit of the chip on film 1 from corrosion; gold has good electrical conductivity, which is not easy to cause signal loss during the signal transmission; and gold has good ductility and can make the contact area of the bonding terminals larger under appropriate pressure, thereby reducing the contact resistance and improving the signal transmission efficiency.

The first row of bonding terminals 13 and the second row of bonding terminals 14 of the chip on film 1 are used for bonding with a display panel (not illustrated in the figure), and then electrically connecting with leads (such as data lines) of the display panel. The region 21 illustrated by the dashed frame in FIG. 2 is the bonding region of the chip on film 1, and the display panel is bonded with the first row of bonding terminals 13 and the second row of bonding terminals 14 in this region. Compared with the chip on film in the related art where only a single row of bonding terminals are provided on the surface, the chip on film 1 provided by the embodiment of the present disclosure provides a double row of bonding terminals on the first surface 19, that is, the first row of bonding terminals 13 and the second row of bonding terminals 14. In this way, the number of double-row bonding terminals is twice the number of single-row bonding terminals in the case of the chip on film with the same width. This greatly increases the number of bonding terminals contained in a chip on film, therefore, it can be connected with more data lines of the display panel, which is beneficial to match the demand of a display panel with high resolution. In addition, this double-row arrangement of bonding terminals can significantly increase the number of bonding terminals of the chip on film 1 without upgrading the bonding equipment used for bonding the chip on film 1 with the display panel.

The body of the second part 200 functions as a lead and is arranged on the second surface 20, and the first end sections 9 of the second part 200 penetrate the chip on film 1 for example through the via holes (not illustrated) in the chip on film 1 and are wound on the first surface 19 of the chip on film 1 to serve as the second row of bonding terminals 14. The arrangement of the leads 6 on the second surface 20 of the chip on film 1 is not illustrated in FIG. 2. In fact, the arrangement of the body of the second part 200 of the leads 6 on the second surface 20 may be the same as the arrangement of the body of the first part 100. Therefore, the arrangement and structural details of the first part 100 of the leads 6 described below are also applicable to the second part 200.

The first part 100 of the leads 6 of the chip on film 1 is divided into a plurality of lead groups, and FIG. 2 shows three lead groups A, B, and C as an example. Each lead group includes a plurality of pads 5, the number of pads 5 is equal to the number of leads 6 in each lead group, and a second end section 8 of each lead 6 opposite to the first end section 9 is connect to one pad 5. The pad 5 is provided with a via hole 17, and each lead 6 is electrically connected to the IC chip 7 of the chip on film 1 through the via hole 17 on the pad 5. The spacing between two adjacent leads 6 in each lead group is h. For example, the spacing between any two adjacent leads 6 in the lead group A is h, the spacing between any two adjacent leads 6 in the lead group B is h, and the spacing between any two adjacent leads 6 in the lead group C is h. The spacing h between two adjacent leads 6 in each lead group is smaller than the spacing T between two adjacent lead groups. For example, the spacing h between two adjacent leads 6 in each lead group is smaller than the spacing T between adjacent lead groups A and B or the spacing T between adjacent lead groups B and C. The spacing T between two adjacent lead groups is greater than a width W of the pad 5 in the first direction D1.

As illustrated in the figure, the width of the first end section 9 of each lead 6 in the first direction D1 is greater than the width of the second end section 8 of each lead 6 in the first direction D1. The width of the lead 6 in the first direction D1 is different. The width of the first end section 9 as the bonding terminal 13 is designed to be larger, on the one hand, the bonding area can be increased, and the alignment accuracy during bonding can be improved; on the other hand, in order to reserve the glue overflow space when the bonding terminal 13 is bonded with the electrode on the display panel, the bonding terminal 13 usually needs to extend beyond the edge of the display panel. By increasing the width of the bonding terminal 13, the rigidity of the bonding terminal 13 can be improved, and the situation that the bonding terminal 13 is bent up and down along the edge of the display panel can be prevented. By reducing the width of the second end section 8 used to connect the lead 6 and the pad 5, the spacing between two adjacent pads 5 can be further reduced, the space utilization can be increased, and a larger number of leads 6 can be arranged. Therefore, it is possible to match a high-resolution display device with a larger number of data lines.

Continuing to refer to FIG. 2, the lengths of the multiple leads 6 in each of the three lead groups A, B, and C have the same changing trend along the first direction D1. For example, as shown in the figure, the lengths of the multiple leads 6 in each lead group gradually decrease from left to right along the first direction D1. The lead 6 located on the leftmost in each lead group has the longest length, and the lead 6 located on the rightmost has the shortest length.

Taking the lead group A as an example, the leftmost lead 6 is connected with the corresponding pad 5, which is referred to as a third pad 5, and the other lead 6 adjacent to the leftmost lead 6 (that is, the second lead 6 in the lead group A from the left) is connected with the corresponding pad 5, which is referred to as a fourth pad 5. The fourth pad 5 is offset from the third pad 5 by a third distance S in the first direction D1, and the third distance S is smaller than the width of the third pad 5 in the first direction D1, and the fourth pad 5 is offset from the third pad 5 by a fourth distance in the second direction D2, and the fourth distance is greater than the length of the third pad 5 in the second direction D2. As illustrated in the figure, the fourth pad 5 is offset from the third pad 5 to the right by the third distance S in the first direction D1, and the third distance S is smaller than the width of the third pad 5 in the first direction D1. The third distance S is substantially equal to the width m of the lead 6 in the first direction D1 plus the spacing h between two adjacent leads 6. The fourth pad 5 is offset from the third pad 5 downward by the fourth distance in the second direction D2, and the fourth distance is greater than the length of the third pad 5 in the second direction D2. With such an offset distance, the fourth pad 5 is located at the lower right of the third pad 5, and there is a certain overlap between the two in the vertical direction. The other pads 5 in the lead group A and the pads 5 in the lead groups B and C all adopt such arrangement.

In the specific setting, since the multiple leads 6 are equally spaced in each lead group, the spacing between two adjacent leads 6 is equal. Therefore, the number of pads 5 in each lead group is determined by the bonding pitch of the bonding terminals of the chip on film 1; and the number of lead groups is directly related to the demand of the data lines. Based on the above arrangement of the pads 5, the number of pads 5 in each lead group satisfies the following formula:

$$\frac{w + (m+h)*(x-1)}{x} \geq h_0$$

where x is the number of pads 5 in each lead group, w is the width of the pad 5 in the first direction D1, m is the width of the lead 6 in the first direction D1, and h is the spacing between two adjacent leads 6, $h_0$ is the bonding pitch between two adjacent bonding terminals in the first row of bonding terminals 13 or the second row of bonding terminals 14. The bonding pitch between two adjacent bonding terminals in the first row of bonding terminals 13 is equal to the bonding pitch between two adjacent bonding terminals in the second row of bonding terminals 14. It should be noted that the "bonding pitch" here refers to the center-to-center distance of two adjacent bonding terminals in the first row of bonding terminals 13 or the second row of bonding terminals 14, and this distance is the minimum value allowed under the electrical requirements and structural requirements. In one example, the bonding pitch $h_0$ of two adjacent bonding terminals is 29 μm, the width of the pad 5 in the first direction D1 is 75 μm, the width m of the lead 6 in the first direction D1 is 11 μm, and the spacing h between two adjacent leads 6 is 11 μm. Substituting these values into the above formula, it can be derived that x is approximately equal to 7, that is, 7 pads 5 can be set in each lead group. Of course, this is only an example, and the number of pads 5 provided in each lead group can be specifically set according to requirements, which is not specifically limited in the embodiments of the present disclosure.

Figure 6A:
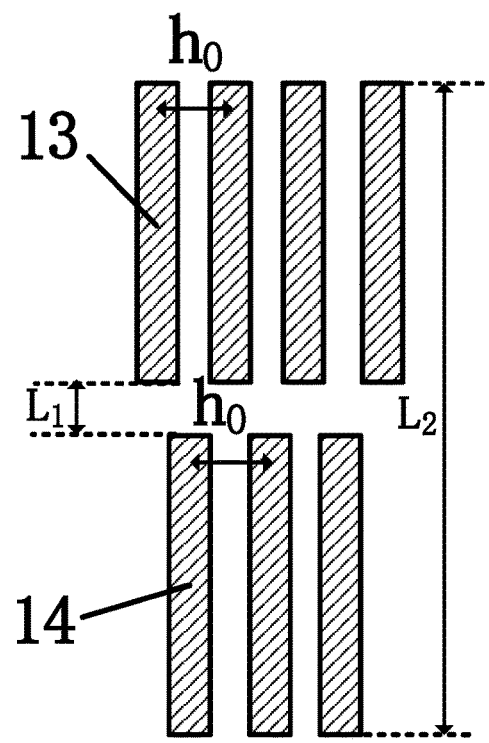
FIG. 6A illustrates a partial schematic diagram of the first row of bonding terminals and the second row of bonding terminals of a chip on film according to an embodiment of the present disclosure.

The second row of bonding terminals 14 is offset by a distance in the first direction D1 relative to the first row of bonding terminals 13, and each of the second row of bonding terminals 14 is located between two adjacent bonding terminals in the first row of bonding terminals 13. FIG. 6A illustrates a partial enlarged view of the first row of bonding terminals 13 and the second row of bonding terminals 14, the first row of bonding terminals 13 is arranged along the first direction D1, and the second row of bonding terminals 14 is also arranged along the first direction D1. However, in the second direction D2, each of the second row of bonding terminals 14 is not vertically aligned with a corresponding one of the first row of bonding terminals 13, but is offset to the right by a certain distance relative to the corresponding one of the first row of bonding terminals 13, so that each of the second row of bonding terminals 14 is located between two adjacent bonding terminals in the first row of bonding terminals 13. Through such arrangement, the parasitic capacitance caused by the overlap between the bonding terminals can be reduced.

Referring back to FIG. 1, the chip on film 1 further comprises a second end 16 opposite to the first end 15 and a widening portion 10 located between the first end 15 and the second end 16. The width of the widening portion 10 in the first direction D1 is greater than the width of the first end 15 and the width of the second end 16 in the first direction D1. The chip on film 1 further comprises an IC chip 7 which is arranged at the widening portion 10. In order to adapt to the ultra-high resolution display panel, the number of data lines of the IC chip 7 of the chip on film 1 is usually more than that of the conventional IC chip. This requires the width of the IC chip 7 in the first direction D1 to be wider than that of the conventional IC chip. If the shape of the chip on film 1 carrying the IC chip 7 is designed to be a regular rectangle, the width of the chip on film 1 in the first direction D1 will be relatively large. Therefore, a display panel with a limited width can only be bonded with a small number of chip on films 1, and the number of bonding terminals of the chip on films 1 cannot meet the requirement of data lines of an ultra-high resolution display panel. In the embodiments of the present disclosure, the chip on film 1 is designed into an irregular shape. That is, the two ends of the chip on film 1 are narrow and the middle of the chip on film 1 is wide. The narrower first end 15 and second end 16 are used to bond with the display panel and the circuit board, respectively, and the wider widening portion 10 is used to carry the IC chip 7. The narrow shape at both ends of the chip on film 1 reduces the width of a single chip on film 1 bonding with the display panel and the circuit board. When the width of the display panel and the circuit board is constant, compared to the conventional chip on film whose both ends have the same width as the widening portion to form a rectangular chip on film, the shape of the chip on film 1 with narrow ends can increase the number of chip on films that are bonded, thereby increasing the number of bonding terminals of the chip on film, so as to better meet the requirement of the data lines of the ultra-high resolution display panel.

One end of the first row of bonding terminals 13 is bonded with the display panel, and the other end is connected with the IC chip 7 through the body of the first part 100 of the plurality of leads 6. One end of the second row of bonding terminals 14 is bonded with the display panel, and the other end is connected with the IC chip 7 through the body of the second part 200 of the plurality of leads 6. The first surface 19 of the second end 16 of the chip on film 1 is actually also arranged with a double row of bonding terminals, whose one end is bonded with the circuit board, and the other end is connected with the IC chip 7 through corresponding leads. The signal applied to the circuit board from the outside is transmitted to the IC chip 7 of the chip on film 1 through the two rows of bonding terminals at the second end 16, and the IC chip 7 processes the signal, and transmits it to the data line of the display panel through the body of the first part 100 of the leads 6 and the two rows of bonding terminals 13 and 14 at the first end 15, and then sends to individual pixels of the display panel, so that the display panel can display a corresponding image. The arrangement of the two rows of bonding terminals at the second end 16 can be substantially same as the arrangement of the two rows of bonding terminals 13 and 14 at the first end 15, which will be described in detail later, so it will not be repeated here.

Figure 3:
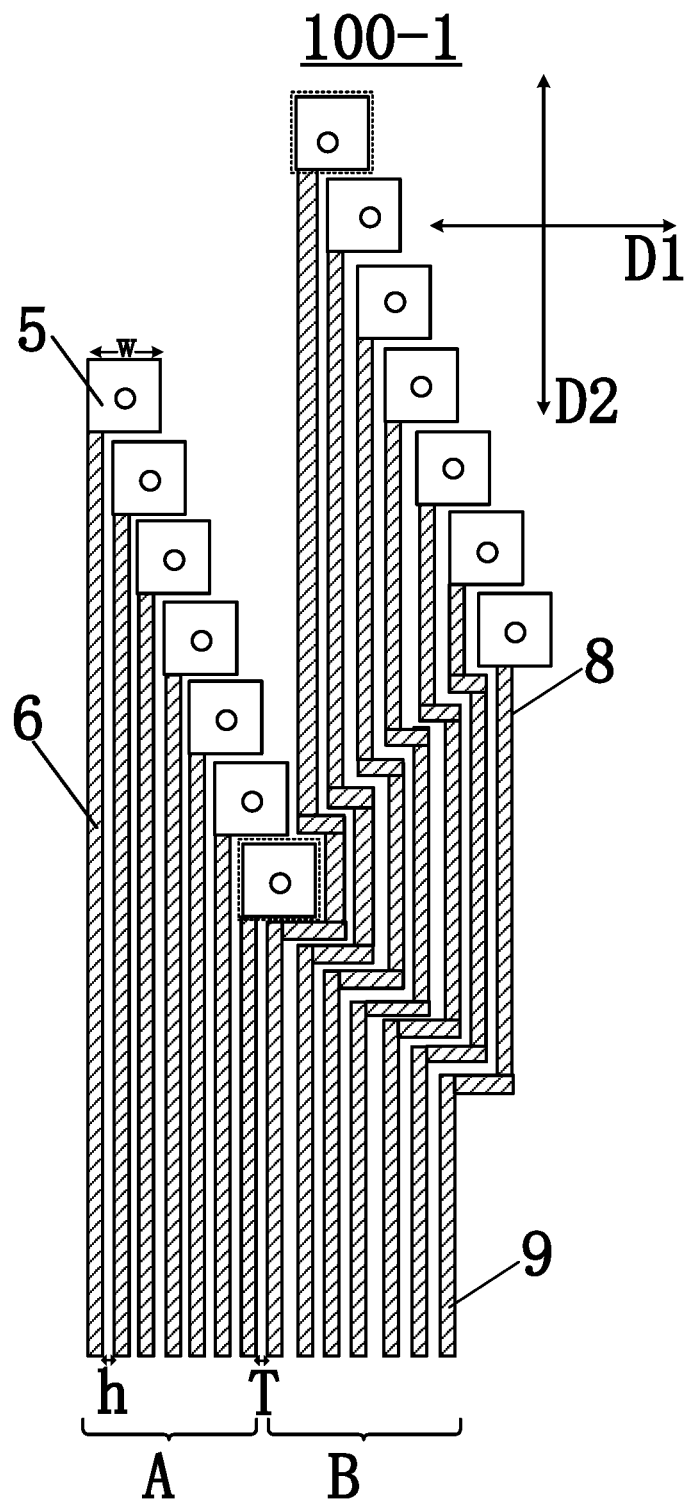
FIG. 3 illustrates another arrangement of leads on the first surface of the chip on film of FIG. 1.

FIG. 3 illustrates another arrangement of the first part 100-1 of the leads 6 on the first surface 19 of the chip on film 1. The arrangement of the first part 100-1 illustrated in FIG. 3 is substantially same as the arrangement of the first part 100 illustrated in FIG. 2. For example, each lead group may comprise 7 pads 5, the first end section 9 of each lead 6 serves as a bonding terminal, and the second end section 8 of each lead 6 is connected to the pad 5, and so on. For the same parts as in FIG. 2, reference may be made to the description about FIG. 2. For the sake of brevity, the following mainly describes differences.

FIG. 3 illustrates two lead groups A and B of the first part 100-1 of the leads 6 as an example, which are denoted as a first lead group A and a second lead group B. Each lead group comprises 7 leads 6 and 7 pads 5. The spacing between two adjacent leads 6 in each lead group is h. For example, the spacing between any two adjacent leads 6 in the first lead group A is h, and the spacing between any two adjacent leads 6 in the second lead group B is h. The spacing h between two adjacent leads 6 in each lead group is equal to the spacing T between two adjacent lead groups A and B, and the spacing T is smaller than the width W of the pad 5 in the first direction D1. In other words, the spacing between any two adjacent leads 6 in the first part 100-1 is equal, and the leads 6 are equally spaced. Such an even-spaced arrangement of the leads 6 is beneficial to simplify the manufacturing process of the chip on film 1. Moreover, the signal lines on the display panel or circuit board bonded with it are usually designed to be equally spaced. The arrangement of the leads 6 of the chip on film 1 can better match the circuit requirements of the display panel or circuit board.

As shown in the figure, a first lead 6 at the edge of the first lead group A (that is, the rightmost lead 6 in the first lead group A) is connected to the pad 5 (denoted as a first pad 5, which is shown in the figure with a dashed frame), and a second lead 6 in the second lead group B adjacent to the first lead 6 (that is, the leftmost lead 6 in the second lead group B) is connected to the pad 5 (denoted as a second pads 5, which is shown in the figure with a dashed frame). The second pad 5 is offset from the first pad 5 in the first direction D1 by a first distance, which is smaller than the width W of the first pad 5 in the first direction D1, and the second pad 5 is offset from the first pad 5 in the second direction D2 by a second distance, which is greater than the length of the first pad 5 in the second direction D2. In the first lead group A, each lead 6 is substantially a straight line; in the second lead group B, each lead 6 is a bent line, and the leads 6 are bent near the first pad 5 and the rightmost pad 5 in the second lead group B. It should be noted that bending the leads 6 near the first pad 5 and the rightmost pad 5 in the second lead group B, on the one hand, it can save area and increase the number of leads 6, on the other hand, it can improve the matching between the chip on film 1 and the display panel or the circuit board.

The lengths of the multiple leads 6 in the first lead group A and the second lead group B have the same changing trend in the first direction D1. For example, as shown in the figure, the lengths of the multiple leads 6 in each lead group gradually decrease from left to right along the first direction D1, the leftmost lead 6 in each lead group has the longest length, and the rightmost lead 6 has the shortest length. The width of each lead 6 in the first direction D1 is uniform, that is, the width of the first end section 9 of each lead 6 in the first direction D1 may be equal to the width of the second end section 8 of each lead 6 in the first direction D1.

Figure 4:
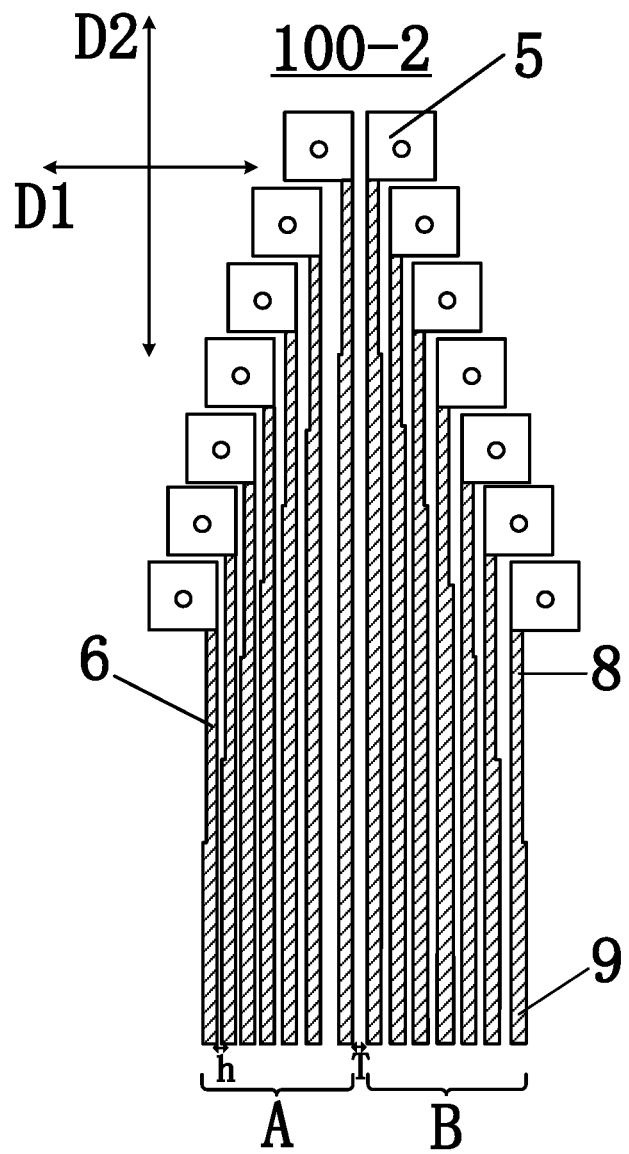
FIG. 4 illustrates still another arrangement of leads on the first surface of the chip on film of FIG. 1.

FIG. 4 shows still another arrangement of the first part 100-2 of the leads 6 on the first surface 19 of the chip on film 1. The arrangement of the first part 100-2 shown in FIG. 4 is substantially same as the arrangement of the first part 100 shown in FIG. 2. For example, each lead group may comprise 7 pads 5, the first end section 9 of each lead 6 serves as a bonding terminal, and the second end section 8 of each lead 6 is connected to the pad 5, and so on. For the same parts as in FIG. 2, reference may be made to the description about FIG. 2. For the sake of brevity, the following mainly describes differences.

FIG. 4 shows two lead groups A and B of the first part 100-2 of the leads 6 as an example. The lengths of the multiple leads 6 in the lead group A gradually increase from left to right along the first direction D1, and the lengths of the multiple leads 6 in the lead group B gradually decrease from left to right along the first direction D1. As shown in the figure, the leftmost lead 6 in the lead group A has the shortest length, and the rightmost lead 6 in the lead group A has the longest length; the leftmost lead 6 in the lead group B has the longest length, and the rightmost lead 6 in the lead group B has the shortest length. The lead group A and the lead group B can be arranged symmetrically, so that the first part 100-2 presents a "back-to-back" style. The spacing between any two adjacent leads 6 in the lead group A is h, and the spacing between any two adjacent leads 6 in the lead group B is h. The spacing h between two adjacent leads 6 in each lead group may be equal to the spacing T between two adjacent lead groups A and B, and the spacing T is smaller than the width W of the pad 5 in the first direction D1. That is to say, the spacing between any two adjacent leads 6 in the first part 100-2 is equal, and the leads 6 are equally spaced. The width of the first part 100-2 as a whole along the first direction D1 provided by this embodiment is about one pad 5 wider than the width of the first part 100-1 as a whole along the first direction D1 shown in FIG. 3. The width of the first end section 9 of each lead 6 in the first direction D1 may be greater than the width of the second end section 8 of each lead 6 in the first direction D1.

It should be noted that the solutions of the various embodiments of the present application can be combined in a variety of ways, for example, the length changing trend of the multiple leads 6 in each lead group along the first direction D1 may be combined with the bending of the leads 6, thereby achieving the purpose of increasing space utilization and increasing the number of leads 6.

Figure 5:
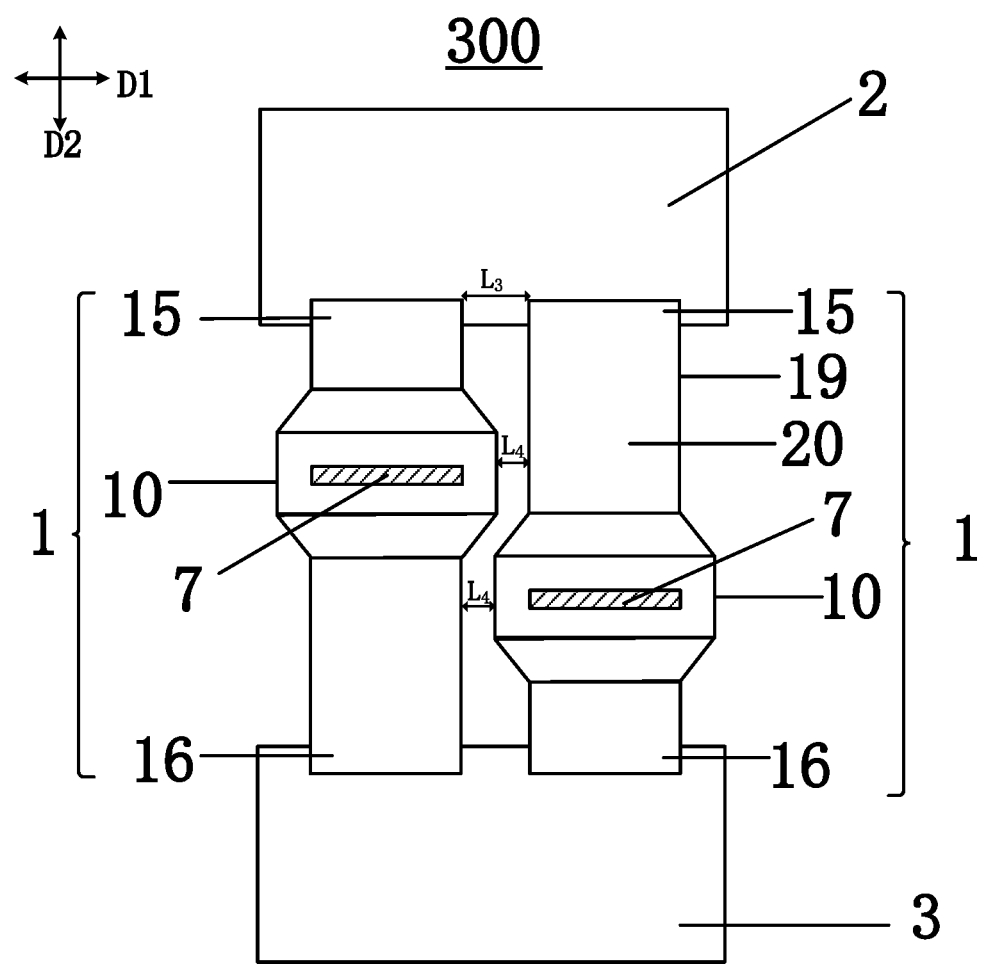
FIG. 5 illustrates a structure of a display device according to an embodiment of the present disclosure.

According to another aspect of the present disclosure, a display device is provided, and FIG. 5 shows a schematic structural diagram of the display device 300. As shown in FIG. 5, the display device 300 includes a display panel 2, a circuit board 3, and at least two chip on films 1 described in any of the previous embodiments. The at least two chip on films 1 are disposed between the display panel 2 and the circuit board 3. The display device 300 may be a large-size display device with high resolution, e.g. a large-size display device with ultra-high-resolution, and the large-size display device may be a display device with an appropriate size such as a TV screen, a shopping mall display screen, or the like. Although FIG. 5 shows that there are two chip on films 1 between the display panel 2 and the circuit board 3, this is only an example for the sake of clear description. In fact, a larger number of chip on films 1 can be provided between the display panel 2 and the circuit board 3, and the embodiment of the present disclosure does not specifically limit the number of chip on films 1.

Figure 6B:
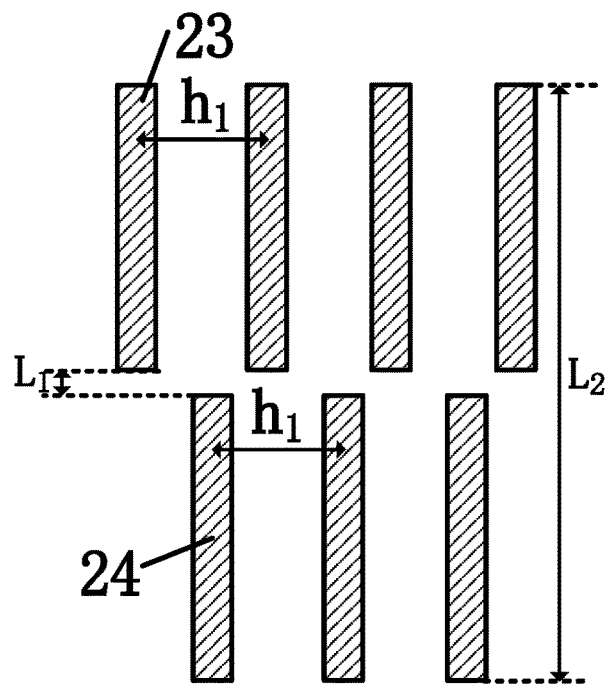
FIG. 6B illustrates a partial schematic diagram of the third row of bonding terminals and the fourth row of bonding terminals of the chip on film according to an embodiment of the present disclosure.

Each chip on film 1 includes the first end 15 and the second end 16. The first surface 19 of the first end 15 is provided with the first row of bonding terminals 13 and the second row of bonding terminals 14 along the first direction D1 as described above. The first row of bonding terminals 13 and the second row of bonding terminals 14 are spaced apart and insulated from each other, and the first row of bonding terminals 13 is closer to the center of the chip on film 1 than the second row of bonding terminals 14. Similarly, the first surface 19 of the second end 16 is provided with a third row of bonding terminals 23 and a fourth row of bonding terminals 24 along the first direction D1. FIG. 6B shows a partial enlarged view of the third row of bonding terminals 23 and the fourth row of bonding terminals 24. The third row of bonding terminals 23 and the fourth row of bonding terminals 24 are spaced apart and insulated from each other, and the third row of bonding terminals 23 is closer to the center of the chip on film 1 than the fourth row of bonding terminals 24. The arrangement of the third row of bonding terminals 23 may be the same as the arrangement of the first row of bonding terminals 13, and the arrangement of the fourth row of bonding terminals 24 may be the same as the arrangement of the second row of bonding terminals 14. The first end 15 of each chip on film 1 is bonded with the display panel 2 through the first row of bonding terminals 13 and the second row of bonding terminals 14, and the second end 16 of each chip on film 1 is bonded with the circuit board 3 through the third row of bonding terminals 23 and the fourth row of bonding terminals 24. The externally applied signal to the circuit board 3 is transmitted to the IC chip 7 of the chip on film 1 through the third row of bonding terminals 23 and the fourth row of bonding terminals 24 at the second end 16 and the corresponding leads 6. The signal is processed by the IC chip 7 and is transmitted to the data lines of the display panel 2 through the corresponding leads 6 and the first row of bonding terminals 13 and the second row of bonding terminals 14 at the first end 15, and then is sent to individual pixels of the display panel 2, so that the display panel 2 can display the corresponding image.

The bonding regions of the display panel 2 and the circuit board 3 are coated with anisotropic conductive film ACF, and the display panel 2 and the circuit board 3 are usually bonded to the bonding regions of the chip on film 1 by hot pressing, realizing the effect of horizontal conduction and longitudinal insulation. Bonding mainly includes two main processes: ACF attachment and local pressing (hot pressing).

The circuit board 3 may be a printed circuit board (PCB) or a flexible printed circuit board (FPC). Generally, flexible display panels differ greatly from rigid display panels in terms of expansion, and there are usually more PCB devices in organic light-emitting diode display devices (AMOLED) than liquid crystal display devices (LCD). The length of PCB used in AMOLED is generally longer, so AMOLED generally chooses XPCB board.

Referring to FIGS. 6A and 6B, the bonding pitch between two adjacent bonding terminals in the first row of bonding terminals 13 is equal to the bonding pitch between two adjacent bonding terminals in the second row of bonding terminals 14, both the bonding pitches are $h_0$; the bonding pitch between two adjacent bonding terminals in the third row of bonding terminals 23 is equal to the bonding pitch between two adjacent bonding terminals in the fourth row of bonding terminals 24, both the bonding pitches are hi; and the bonding pitch $h_0$ between two adjacent bonding terminals in the first row of bonding terminals 13 is smaller than the bonding pitch hi between two adjacent bonding terminals in the third row of bonding terminals 23. This is because the first row of bonding terminals 13 and the second row of bonding terminals 14 are bonded with the high-resolution display panel 2, since the high-resolution display panel 2 has more data lines, in order to match with the display panel 2, the bonding pitch $h_0$ between two adjacent bonding terminals in the first row of bonding terminals 13 and the second row of bonding terminals 14 is relatively small. The third row of bonding terminals 23 and the fourth row of bonding terminals 24 are bonded with the circuit board 3, since there is no need to provide so many signal lines on the circuit board 3, the bonding pitch hi between adjacent two bonding terminals in the third row of bonding terminals 23 and the fourth row of bonding terminals 24 may be relatively large. In an example, the bonding pitch $h_0$ between two adjacent bonding terminals in the first row of bonding terminals 13 or the second row of bonding terminals 14 is 29 μm, and the bonding pitch hi between two adjacent bonding terminals in the third row of bonding terminals 23 or the fourth row of bonding terminals 24 is 280 μm. As shown in FIGS. 6A and 6B, in an example, the distance $L_1$ between the first row of bonding terminals 13 and the second row of bonding terminals 14 is 0.2 mm, and the length $L_2$ occupied by the first row of bonding terminals 13 and the second row of bonding terminals 14 in the second direction D2 is 2 mm. The distance $L_1$ between the third row of bonding terminals 23 and the fourth row of bonding terminals 24 is 0.2 mm, and the length $L_2$ occupied by the third row of bonding terminals 23 and the fourth row of bonding terminals 24 in the second direction D2 is 2 mm.

As shown in FIG. 5, the widening portions 10 of the two chip on films 1 are arranged in a staggered manner, so as to avoid that the widening portions 10 of the two chip on films 1 are on the same horizontal line and cause the two chip on films 1 to occupy an excessive width along the first direction D1, so that the space utilization can be improved, and the display device 300 can accommodate more chip on films 1 to meet the wiring requirements of the high-resolution display panel 2. As shown in the figure, in an example, the distance $L_3$ between the first ends 15 of the two chip on films 1 is 5 mm, the distance $L_4$ between the widening portion 10 of the left chip on film 1 and the first end 15 of the right chip on film 1 is 1 mm, and the distance $L_4$ between the second end 16 of the left chip on film 1 and the widening portion 10 of the right chip on film 1 is 1 mm.

The display panel 2 provided by the embodiment of the present disclosure includes a liquid crystal display panel or an organic light emitting diode display panel.

The display device 300 provided by the embodiment of the present disclosure may be display terminal devices with display functions, such as a TV, a PC, a smart phone, a tablet computer, an e-book reader, an MP3 (Moving Picture Experts Group Audio Layer III) player, an MP4 (Moving Picture Experts Group Audio Layer IV) player, a portable computer and the like.

Since the display device 300 can have substantially the same technical effects as the chip on film 1 described in the previous embodiments, for the sake of brevity, the technical effects of the display device 300 will not be repeated here.

It will be understood that, although the terms first, second, third etc. may be used herein to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed above could be termed a second element, component, region, layer or part without departing from the teachings of the present disclosure.

Spatially relative terms, such as "row", "column", "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of a device in use or operation in addition to the orientation depicted in the figures. For example, if a device in the figures is turned over, elements described as "below", "beneath" or "under" other elements or features would then be oriented "above" the other elements or features. Thus, the exemplary terms "below" and "under" can encompass both orientations of "above" and "below". The device may be otherwise oriented (rotated 90 degrees or at other orientations) and the spatially relative descriptors used herein may be interpreted accordingly. In addition, it will also be understood that when a layer is referred to as being "between" two layers, it can be the only layer between the two layers, or there may also be one or more intervening layers.

The terminologies used herein are for the purpose of describing particular embodiments only and are not intended to be limiting of the disclosure. As used herein, the singular forms "a", "an" and "the" are intended to include the plural forms as well, unless the context clearly indicates otherwise. It will be further understood that the terms "comprise" and/or "include", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. In the description of this specification, the description with reference to the terms "one embodiment", "another embodiment", etc. means that a specific feature, structure, material, or characteristic described in conjunction with the embodiment is included in at least one embodiment of the present disclosure. In this specification, the schematic representations of the above terms do not necessarily refer to the same embodiment or example. Moreover, the described specific features, structures, materials or characteristics can be combined in any one or more embodiments or examples in a suitable manner. In addition, those skilled in the art can incorporate and combine the different embodiments or examples and the features of the different embodiments or examples described in this specification without contradicting each other.

It will be understood that when an element or layer is referred to as being "on", "connected to", "coupled to", or "adjacent to" another element or layer, it can be directly on, connected, coupled, or adjacent to the other element or layer, or there may be intervening elements or layers. In contrast, when an element is referred to as being "directly on," "directly connected to", "directly coupled to", or "directly adjacent to" another element or layer, there are no intervening elements or layers. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein, but are to include deviations in shapes that result, for example, from manufacturing. Accordingly, the regions illustrated in the figures are schematic in nature and their shapes are not intended to illustrate the actual shapes of the regions of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The above are only specific implementations of the present disclosure, but the protection scope of the present disclosure is not limited thereto. Any person skilled in the art can easily think of changes or substitutions within the technical scope disclosed in the present disclosure, and the changes or substitutions should be encompassed by the protection scope of the present disclosure. Therefore, the protection scope of the present disclosure should be subject to the protection scope of the claims.

The invention claimed is:

1. A chip on film comprising:
   a first end, wherein a first row of bonding terminals and a second row of bonding terminals are arranged in a first direction on a first surface of the first end, the first row of bonding terminals and the second row of bonding terminals are spaced apart and insulated from each other, and the first row of bonding terminals is closer to a center of the chip on film than the second row of bonding terminals;
   a plurality of leads, extending in a second direction intersecting with the first direction, the plurality of leads comprising a first part and a second part;
   a second end opposite to the first end; and
   a widening portion between the first end and the second end,
   wherein the first part is arranged on the first surface of the chip on film, a number of leads in the first part is equal to a number of bonding terminals in the first row of bonding terminals, and a first end section of each lead of the first part serves as a corresponding one of the first row of bonding terminals;
   wherein a body of the second part is arranged on a second surface of the chip on film facing away from the first surface, a first end section of the second part penetrates the chip on film and is arranged on the first surface of the chip on film, a number of leads in the second part is equal to a number of bonding terminals in the second row of bonding terminals, and the first end section of each lead of the second part serves as a corresponding one of the second row of bonding terminals; and
   wherein a width of the widening portion in the first direction is greater than a width of the first end and a width of the second end in the first direction.

2. The chip on film according to claim 1, wherein the plurality of leads are divided into a plurality of lead groups, and a spacing between two adjacent leads in each lead group of the plurality of lead groups is equal.

3. The chip on film according to claim 2, wherein each lead group further comprises a plurality of pads, and a number of the plurality of pads is equal to a number of leads in each lead group, and a second end section of each lead in each lead group opposite to the first end section is connected to a corresponding one of the plurality of pads.

4. The chip on film according to claim 3, wherein the spacing between two adjacent leads in each lead group is smaller than a spacing between two adjacent lead groups.

5. The chip on film according to claim 4, wherein the spacing between two adjacent lead groups is greater than a width of one of the plurality of pads in the first direction.

6. The chip on film according to claim 3, wherein a width of the first end section of each lead in the first direction is greater than a width of the second end section of each lead in the first direction.

7. The chip on film according to claim 3, wherein the spacing between two adjacent leads in each lead group is equal to a spacing between two adjacent lead groups.

8. The chip on film according to claim 7, wherein the spacing between two adjacent lead groups is smaller than a width of one of the plurality of pads in the first direction.

9. The chip on film according to claim 8,
   wherein in adjacent first lead group and second lead group of the plurality of lead groups, a first lead at an edge in the first lead group is connected to a first pad, and a second lead in the second lead group adjacent to the first lead is connected to a second pad, and
   wherein the second pad is offset from the first pad by a first distance in the first direction, the first distance is smaller than a width of the first pad in the first direction, and the second pad is offset from the first pad by a second distance in the second direction.

10. The chip on film according to claim 9, wherein each lead in a part of the plurality of lead groups is a bent line.

11. The chip on film according to claim 3, wherein lengths of the plurality of leads in each lead group gradually decrease in the first direction, or lengths of the plurality of leads in one lead group of the plurality of lead groups gradually increase in the first direction, and lengths of the plurality of leads in another lead group adjacent to the one lead group gradually decrease in the first direction.

12. The chip on film according to claim 11,
    wherein in each lead group, one lead is connected to a third pad, and another lead adjacent to the one lead is connected to a fourth pad, and
    wherein the fourth pad is offset from the third pad by a third distance in the first direction, and the third distance is smaller than a width of the third pad in the first direction, the fourth pad is offset from the third pad by a fourth distance in the second direction, and the fourth distance is greater than a length of the third pad in the second direction.

13. The chip on film according to claim 12, wherein a number of pads in each lead group satisfies a formula:

$$\frac{w + (m + h) * (x - 1)}{x} \geq h_0$$

where x is the number of pads in each lead group, w is a width of the pad in the first direction, m is a width of the lead in the first direction, h is the spacing between two adjacent leads, h0 is a bonding pitch between two adjacent bonding terminals in the first row of bonding terminals or the second row of bonding terminals.

14. The chip on film according to claim 1, wherein the second row of bonding terminals is offset by a distance in the first direction relative to the first row of bonding terminals, and each of the second row of bonding terminals is between two adjacent bonding terminals in the first row of bonding terminals.

15. The chip on film according to claim 1, further comprising:
    an integrated circuit,
    wherein the integrated circuit is arranged at the widening portion, and the first row of bonding terminals and the second row of bonding terminals are respectively connected to the integrated circuit through the first part and the second part of the plurality of leads.

16. A display device comprising a display panel, a circuit board, and at least two chip on films according to claim 1.

17. The display device according to claim 16, wherein each of the at least two chip on films further comprises a third row of bonding terminals and a fourth row of bonding terminals arranged in the first direction on the first surface of the second end, the third row of bonding terminals and the fourth row of bonding terminals are spaced apart and insulated from each other, and the third row of bonding terminals is closer to the center of the chip on film than the fourth row of bonding terminals,
- wherein the first end of each chip on film is bonded to the display panel through the first row of bonding terminals and the second row of bonding terminals, and
- wherein the second end of each chip on film is bonded to the circuit board through the third row of bonding terminals and the fourth row of bonding terminals.

18. The display device according to claim 17, wherein a bonding pitch between two adjacent bonding terminals in the first row of bonding terminals is equal to a bonding pitch between two adjacent bonding terminals in the second row of bonding terminals, a bonding pitch between two adjacent bonding terminals in the third row of bonding terminals is equal to a bonding pitch between two adjacent bonding terminals in the fourth row of bonding terminals, and the bonding pitch between two adjacent bonding terminals in the first row of bonding terminals is smaller than the bonding pitch between two adjacent bonding terminals in the third row of bonding terminals.

19. The display device according to claim 17,
- wherein respective widening portions of two adjacent chip on films of the at least two chip on films are arranged in a staggered manner.

20. A chip on film comprising:
- a first end, wherein a first row of bonding terminals and a second row of bonding terminals are arranged in a first direction on a first surface of the first end, the first row of bonding terminals and the second row of bonding terminals are spaced apart and insulated from each other, and the first row of bonding terminals is closer to a center of the chip on film than the second row of bonding terminals; and
- a plurality of leads, extending in a second direction intersecting with the first direction, the plurality of leads comprising a first part and a second part, wherein the first part is arranged on the first surface of the chip on film, a number of leads in the first part is equal to a number of bonding terminals in the first row of bonding terminals, and a first end section of each lead of the first part serves as a corresponding one of the first row of bonding terminals;
- wherein a body of the second part is arranged on a second surface of the chip on film facing away from the first surface, a first end section of the second part penetrates the chip on film and is arranged on the first surface of the chip on film, a number of leads in the second part is equal to a number of bonding terminals in the second row of bonding terminals, and the first end section of each lead of the second part serves as a corresponding one of the second row of bonding terminals; and
- wherein the second row of bonding terminals is offset by a distance in the first direction relative to the first row of bonding terminals, and each of the second row of bonding terminals is between two adjacent bonding terminals in the first row of bonding terminals.

* * * * *